US011251120B2

(12) United States Patent
Lee

(10) Patent No.: US 11,251,120 B2
(45) Date of Patent: Feb. 15, 2022

(54) SEMICONDUCTOR MEMORY DEVICE AND METHOD OF MANUFACTURING THE SAME

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 26 days.

(21) Appl. No.: 16/918,530

(22) Filed: Jul. 1, 2020

(65) Prior Publication Data

US 2021/0210426 A1 Jul. 8, 2021

(30) Foreign Application Priority Data

Jan. 7, 2020 (KR) .................. 10-2020-0002175

(51) Int. Cl.
*H01L 23/522* (2006.01)
*H01L 27/11582* (2017.01)
*H01L 27/11556* (2017.01)
*H01L 21/768* (2006.01)
*H01L 27/24* (2006.01)
*H01L 27/11548* (2017.01)
*H01L 27/11575* (2017.01)

(52) U.S. Cl.
CPC .... *H01L 23/5226* (2013.01); *H01L 21/76802* (2013.01); *H01L 21/76877* (2013.01); *H01L 27/11556* (2013.01); *H01L 27/11582* (2013.01); *H01L 27/2481* (2013.01); *H01L 27/11548* (2013.01); *H01L 27/11575* (2013.01)

(58) Field of Classification Search
CPC .......... H01L 23/5226; H01L 27/11582; H01L 27/11556; H01L 21/76877; H01L 21/76802; H01L 27/2481; H01L 27/11548; H01L 27/11575; H01L 27/1157; H01L 27/11573; H01L 29/792
See application file for complete search history.

(56) References Cited

U.S. PATENT DOCUMENTS

| 10,818,542 | B2 * | 10/2020 | Cui ................... H01L 21/7682 |
| 10,985,176 | B2 * | 4/2021 | Iwai ................. H01L 27/11529 |
| 10,998,331 | B2 * | 5/2021 | Zhou ................ H01L 27/11582 |
| 2018/0366483 | A1 | 12/2018 | Choi |

FOREIGN PATENT DOCUMENTS

| KR | 1020120053329 A | 5/2012 |
| KR | 1020180019807 A | 2/2018 |

* cited by examiner

*Primary Examiner* — Karen Kusumakar
(74) *Attorney, Agent, or Firm* — William Park & Associates Ltd.

(57) ABSTRACT

A semiconductor memory device includes a channel structure extending in a first direction, a source select line surrounding the channel structure and including a groove, interlayer insulating films and word lines surrounding the channel structure, wherein the interlayer insulating films and the word lines are alternately stacked on the source select line in the first direction, and a first contact plug extending into the source select line through the groove.

20 Claims, 17 Drawing Sheets

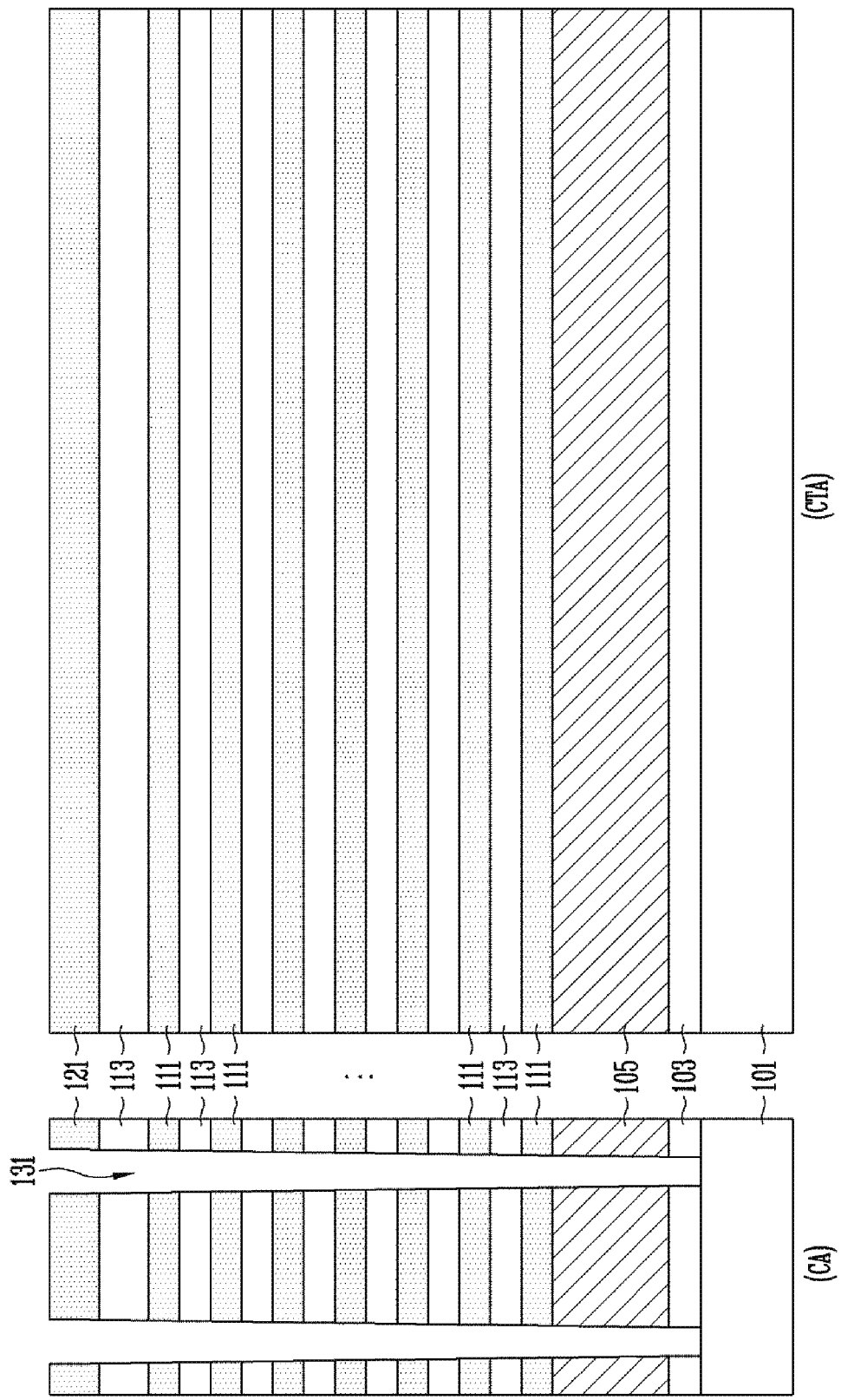

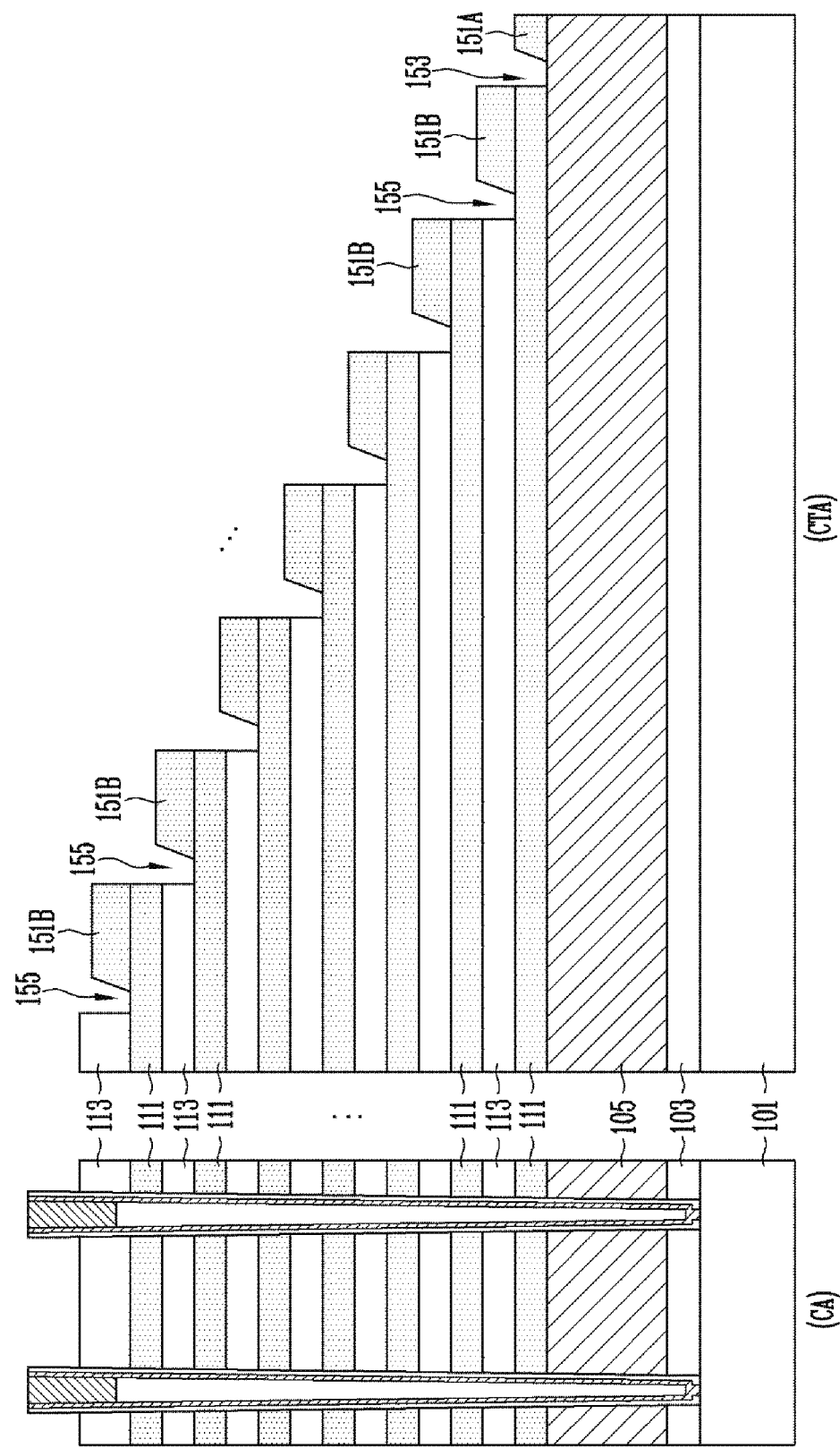

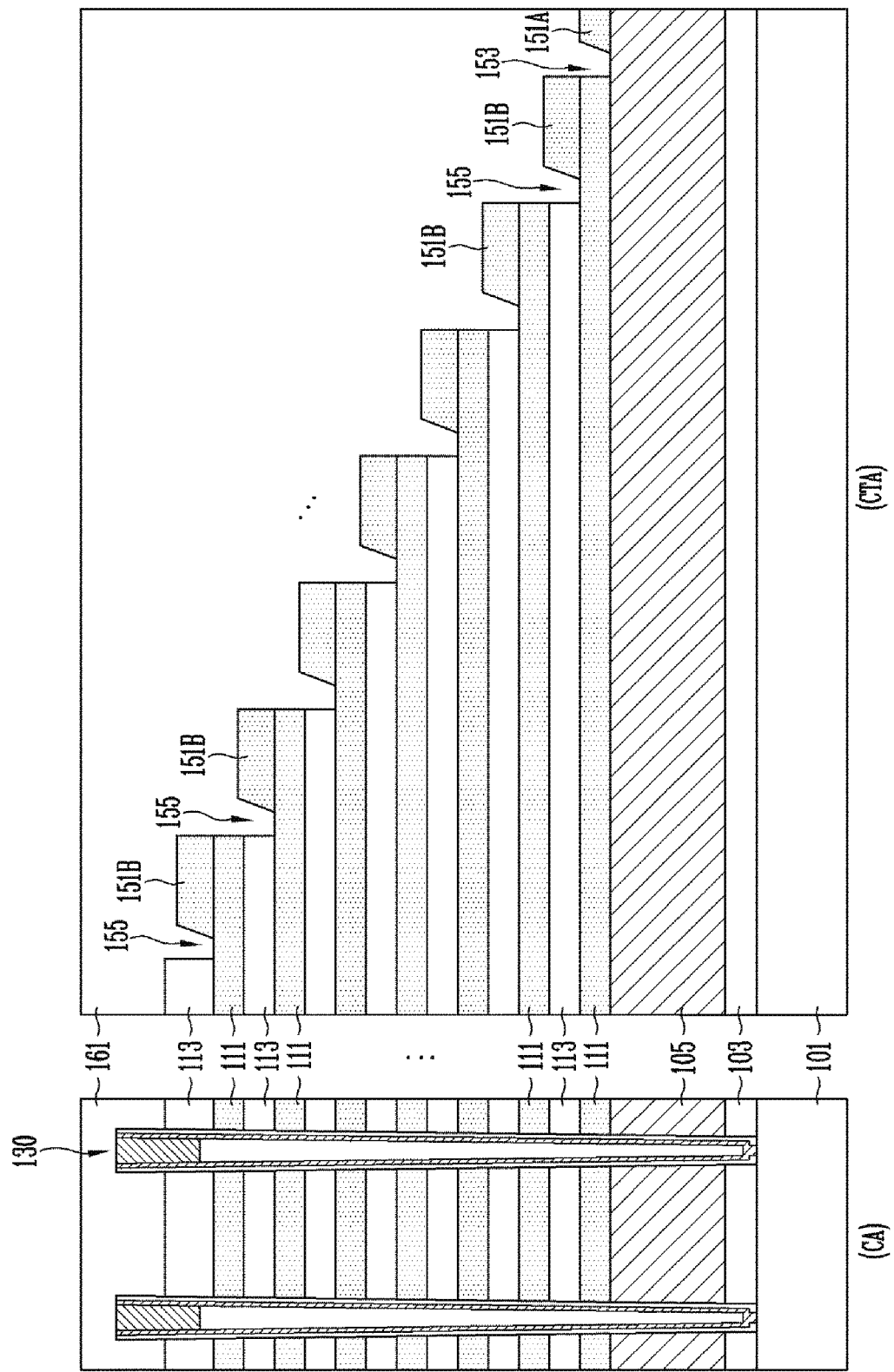

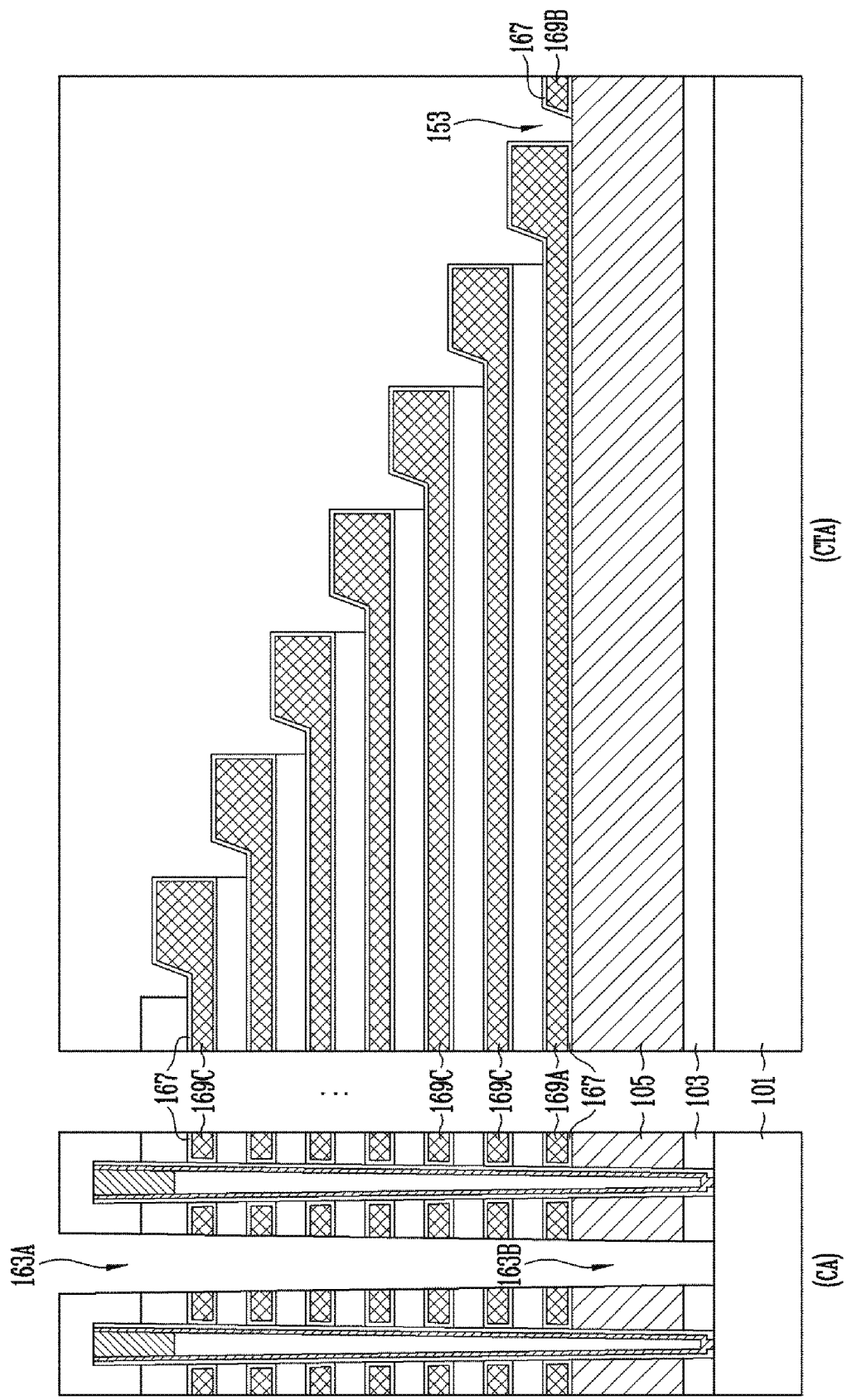

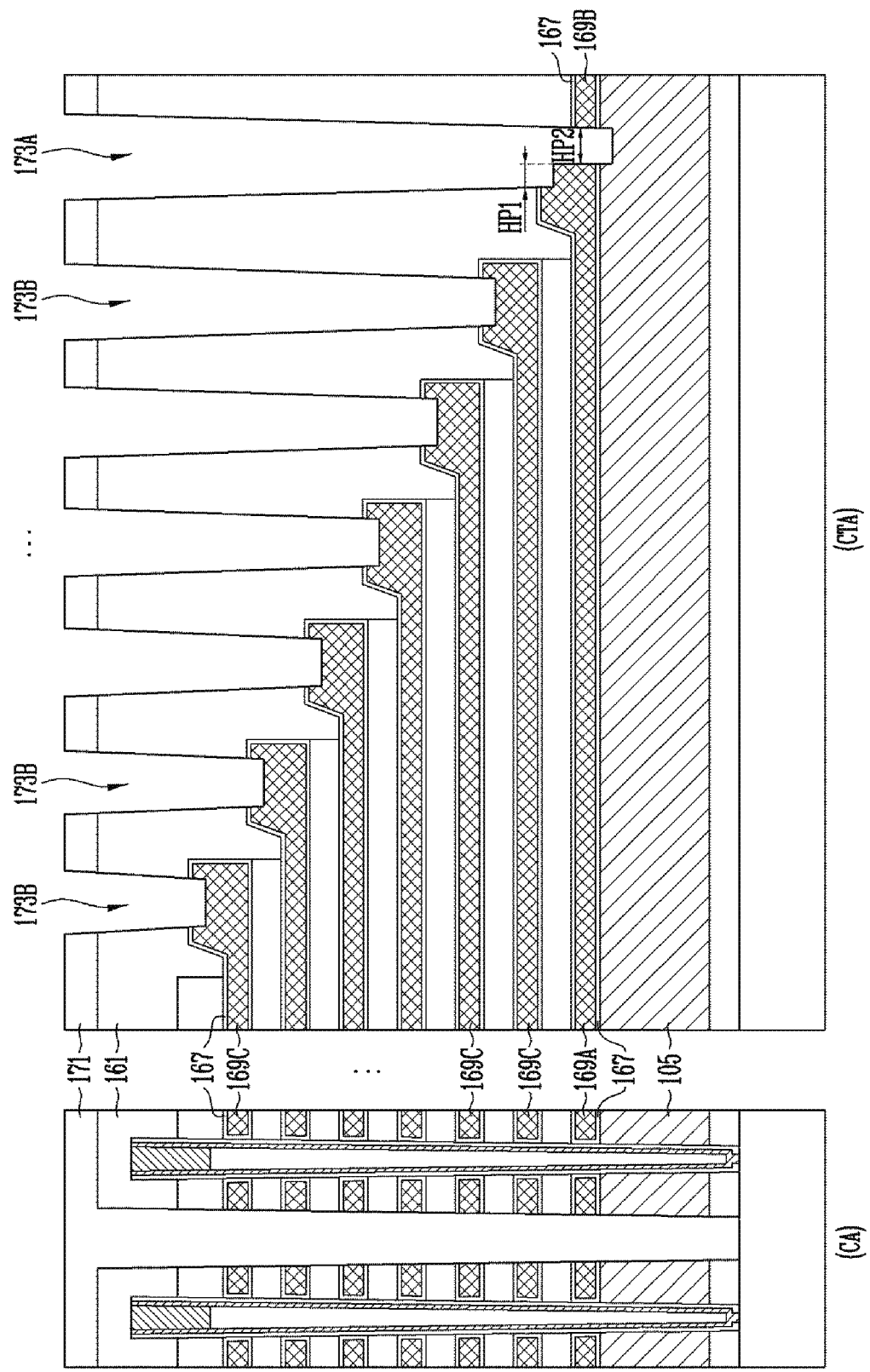

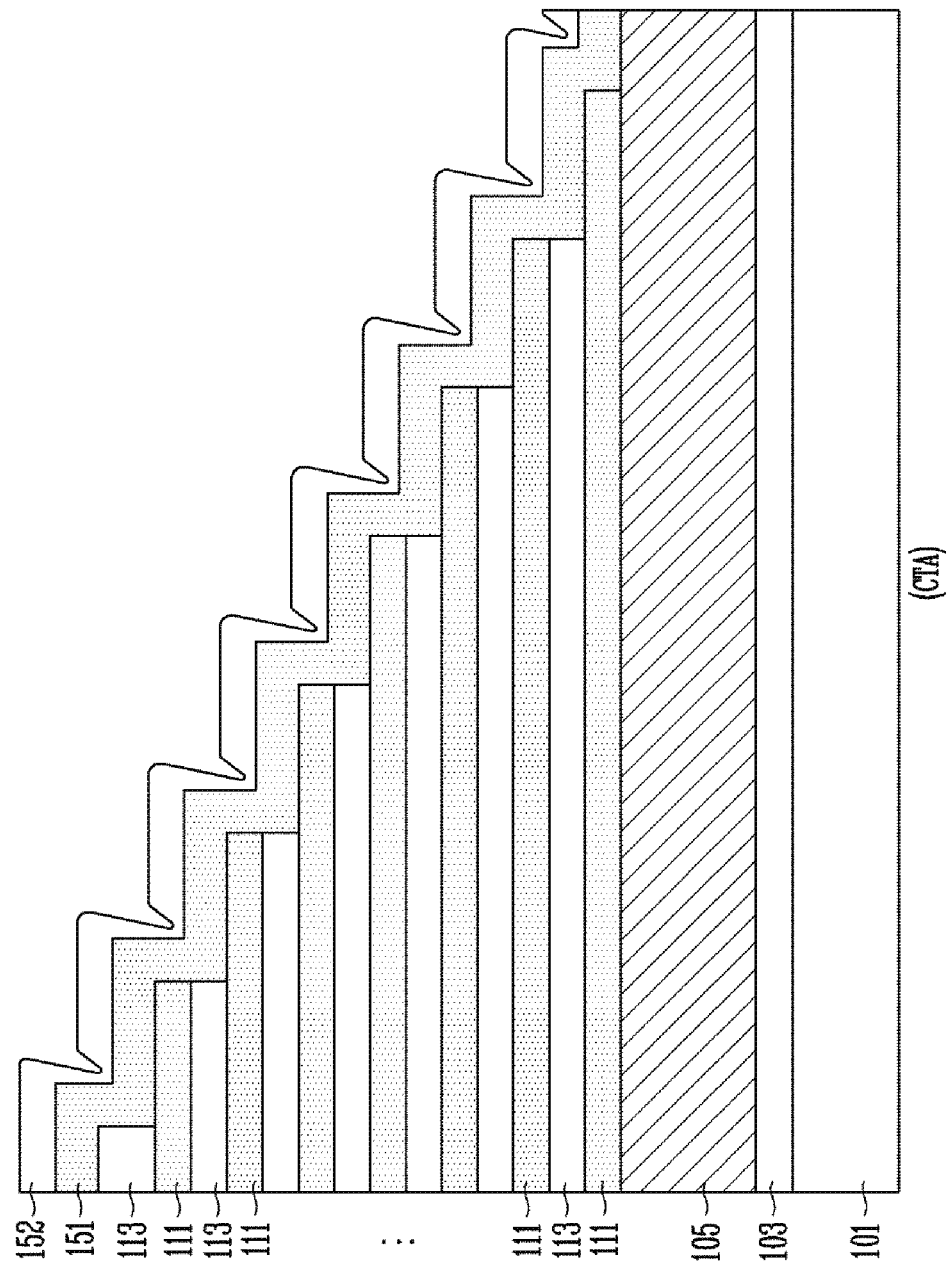

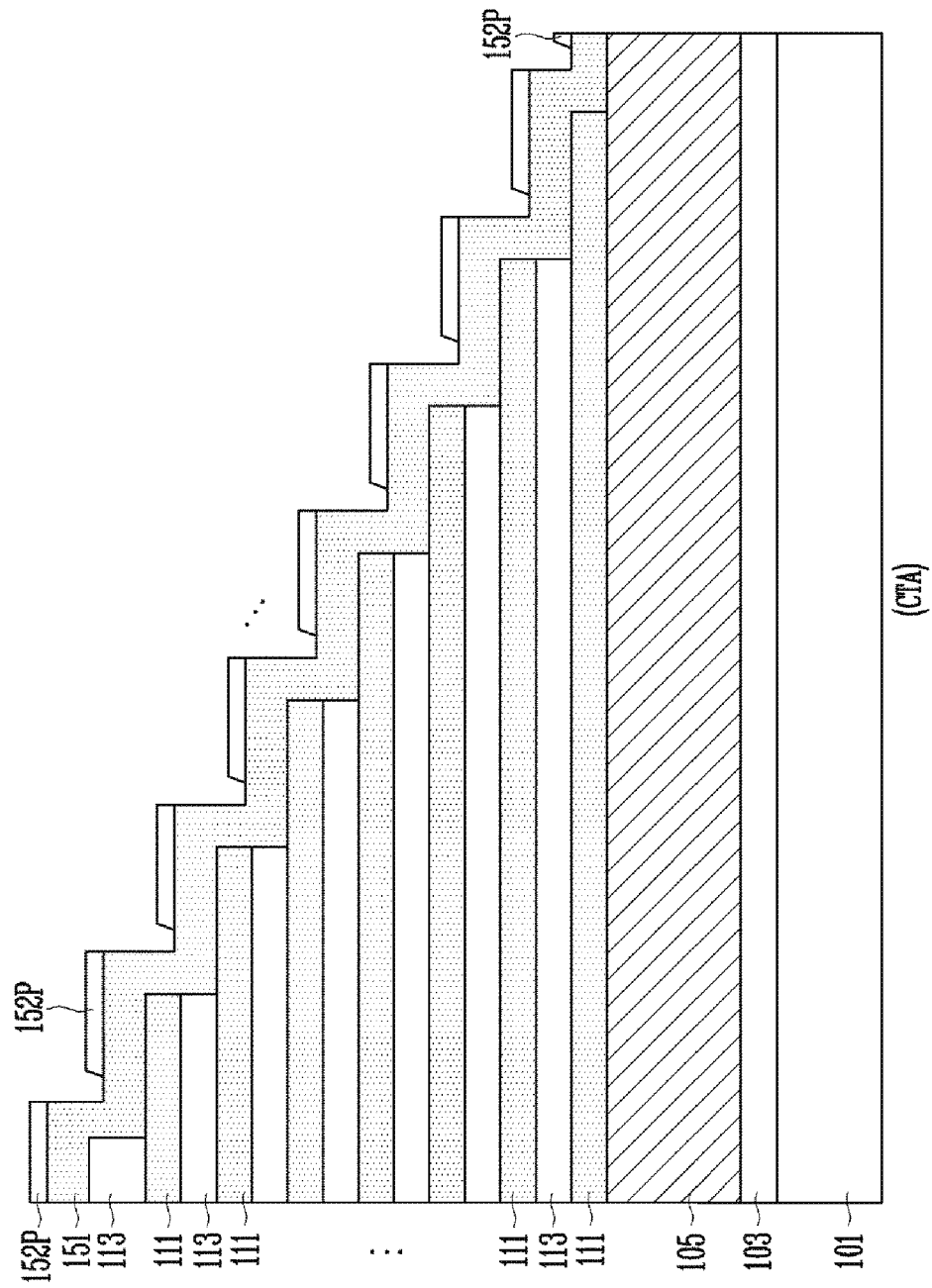

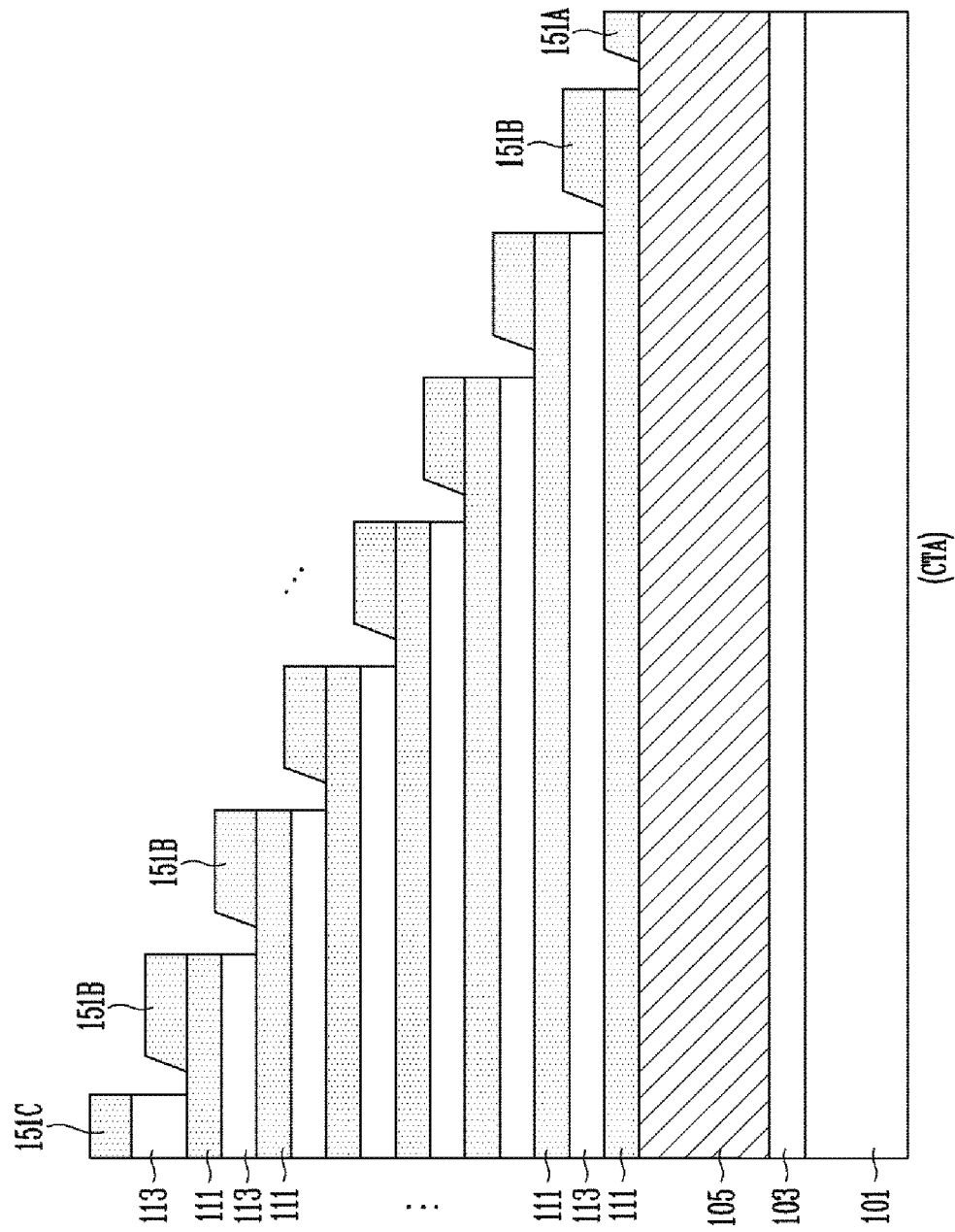

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2020-0002175, filed on Jan. 7, 2020, in the Korean Intellectual Property Office, the entire disclosure of which is incorporated herein by reference.

BACKGROUND

1. Technical Field

Various embodiments of the present disclosure relates to a semiconductor memory device and a method of manufacturing the same, and more particularly, to a three-dimensional semiconductor memory device and a method of manufacturing the same.

2. Related Art

A semiconductor memory device includes a plurality of memory cells that are capable of storing data. In order to implement a three-dimensional semiconductor memory device, the plurality of memory cells may be arranged three-dimensionally.

The plurality of three-dimensionally-arranged memory cells may be connected to conductive patterns that are stacked and spaced apart from each other. The conductive patterns may be disposed at different levels. The conductive patterns may be connected to a peripheral circuit through contact plugs.

SUMMARY

In accordance with an embodiment of the present disclosure, a semiconductor memory device may include a channel structure extending in a first direction, a source select line surrounding the channel structure and including a groove, interlayer insulating films and word lines surrounding the channel structure, wherein the interlayer insulating films and the word lines are alternately stacked on the source select line in the first direction, and a first contact plug extending into the source select line through the groove.

In accordance with an embodiment of the present disclosure, a method of manufacturing a semiconductor memory device may include forming a lower conductive film; forming a stepped stack including alternately stacked sacrificial films and interlayer insulating films on the lower conductive film such that upper surfaces of the sacrificial films are exposed; forming a first pad pattern overlapping with the lower conductive film, wherein the first pad pattern is adjacent to a lowermost sacrificial film among the sacrificial films, and wherein a groove is interposed between the first pad pattern and the lowermost sacrificial film; forming second pad patterns respectively overlapping with the upper surfaces of the sacrificial films; forming an insulating film covering the first and second pad patterns and the stepped stack; replacing the sacrificial films, the first pad pattern, and the second pad patterns with a conductive material; and forming a first contact plug passing through a portion of the insulating film that overlaps with the groove, and extending into the lower conductive film.

BRIEF DESCRIPTION OF THE DRAWINGS

FIGS. 7A to 7H are cross-sectional views illustrating a method of manufacturing the semiconductor memory device according to an embodiment of the present disclosure.

FIGS. 8A to 8C are cross-sectional views illustrating an embodiment of forming pad patterns shown in FIG. 7C.

DETAILED DESCRIPTION

The specific structural or functional descriptions disclosed herein are merely illustrative for the purpose of describing embodiments according to the concept of the present disclosure. The embodiments may be implemented in various forms, and should not be construed as being limited to the specific embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments of the present disclosure are directed to a semiconductor memory device and a method of manufacturing the same capable of stably connecting a conductive pattern and a contact plug to each other.

Figure 1:
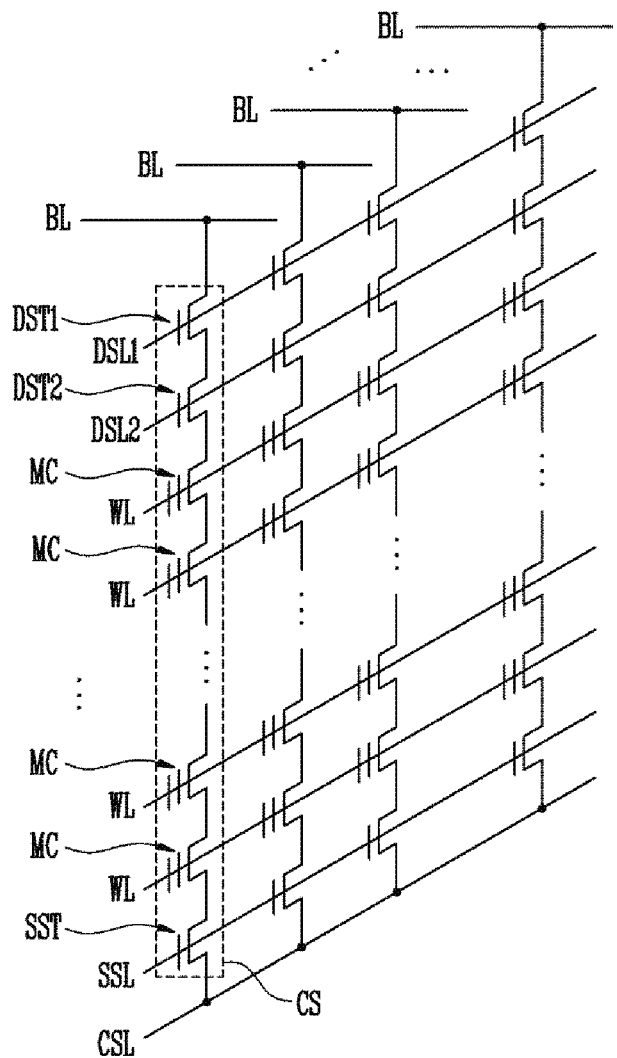
FIG. 1 is a schematic circuit diagram of a semiconductor memory device according to an embodiment of the present disclosure.

FIG. 1 is a schematic circuit diagram of a semiconductor memory device according to an embodiment of the present disclosure.

Referring to FIG. 1, the semiconductor memory device may include a plurality of cell strings CS that are connected to a common source line CSL. The cell strings CS may be arranged in a plurality of rows and a plurality of columns. For convenience of recognition, FIG. 1 shows cell strings CS in one row. Each of the cell strings CS in the row may be connected to a different bit line BL, among a plurality of bit lines BL.

Each of the cell strings CS may include a plurality of memory cells MC, a source select transistor SST, and drain select transistors DST1 and DST2, all of which may be connected in series. The source select transistor SST may control an electrical connection between the cell string CS corresponding to the source select transistor SST, and the common source line CSL. The drain select transistors DST1 and DST2 may control an electrical connection between the cell string CS that corresponds to the drain select transistors DST1 and DST2 and the bit line BL that corresponds to the drain select transistors DST1 and DST2. Each of the cell strings CS may include one drain select transistor or two or more drain select transistors that are connected in series. For example, FIG. 1 illustrates a case in which each of the cell strings CS includes a first drain select transistor DST1 and a second drain select transistor DST2 that are connected in series.

The cell strings CS may be connected to conductive patterns DSL1, DSL2, WL, and SSL that extend along a row direction. The conductive patterns DSL1, DSL2, WL, and SSL may include a first drain select line DSL1, a second drain select line DSL2, word lines WL, and a source select line SSL. The source select line SSL may be connected to a gate electrode of the source select transistor SST, the word lines WL may be respectively connected to gate electrodes of the memory cells MC, the first drain select line DSL1 may be connected to a gate electrode of the first drain select transistor DST1, and the second drain select line DSL2 may be connected to a gate electrode of the second drain select transistor DST2.

The above-described conductive patterns DSL1, DSL2, WL, and SSL may configure a gate stack.

Figure 2:
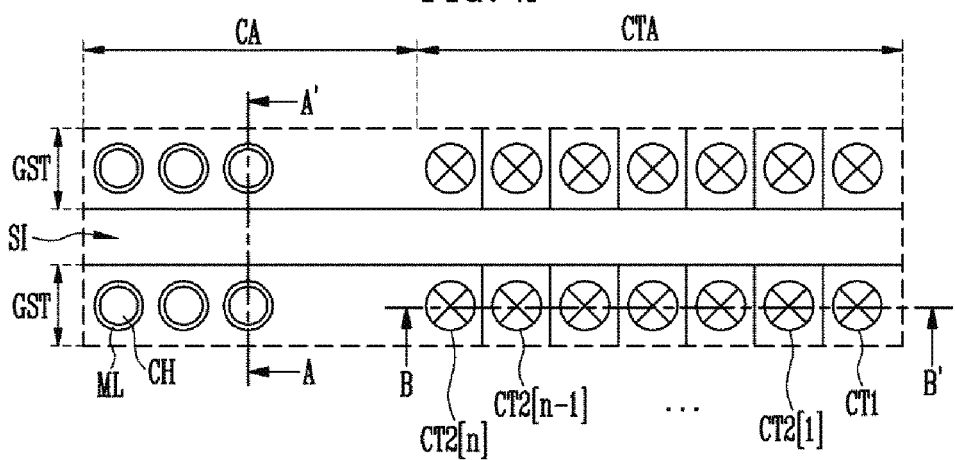
FIG. 2 is a plan view illustrating gate stacks according to an embodiment of the present disclosure.

FIG. 2 is a plan view illustrating gate stacks GST according to an embodiment of the present disclosure.

Referring to FIG. 2, each of the gate stacks GST may include a cell region CA that surrounds a channel structure CH, and a contact region CTA that extends from the cell region CA. The gate stacks GST may be separated from each other by a slit SI.

The channel structure CH may pass through the gate stack GST. The channel structure CH may be used as a channel region of a cell string that corresponds to the channel structure CH. The channel structure CH may be surrounded by a memory film ML. The memory film ML may include a data storage film that is used as a data storage area of the memory cell.

Figure 3A:
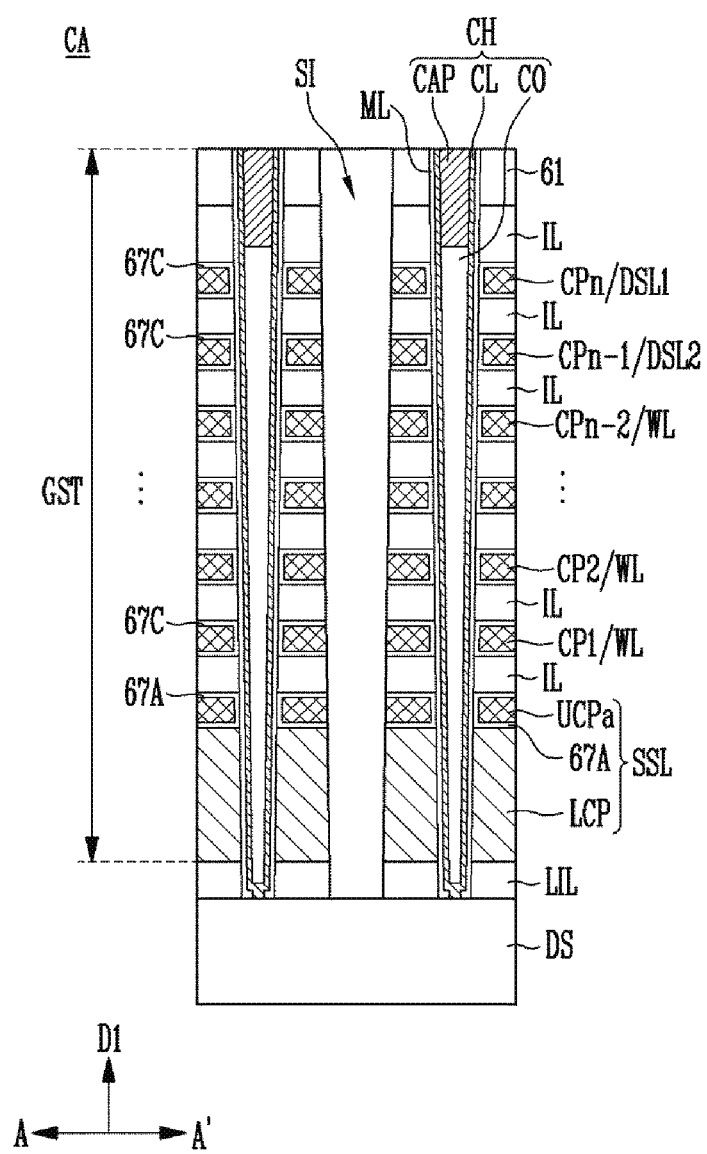
FIG. 3A is a cross-sectional view that is taken along a line A-A' shown in FIG. 2.
Figure 3B:
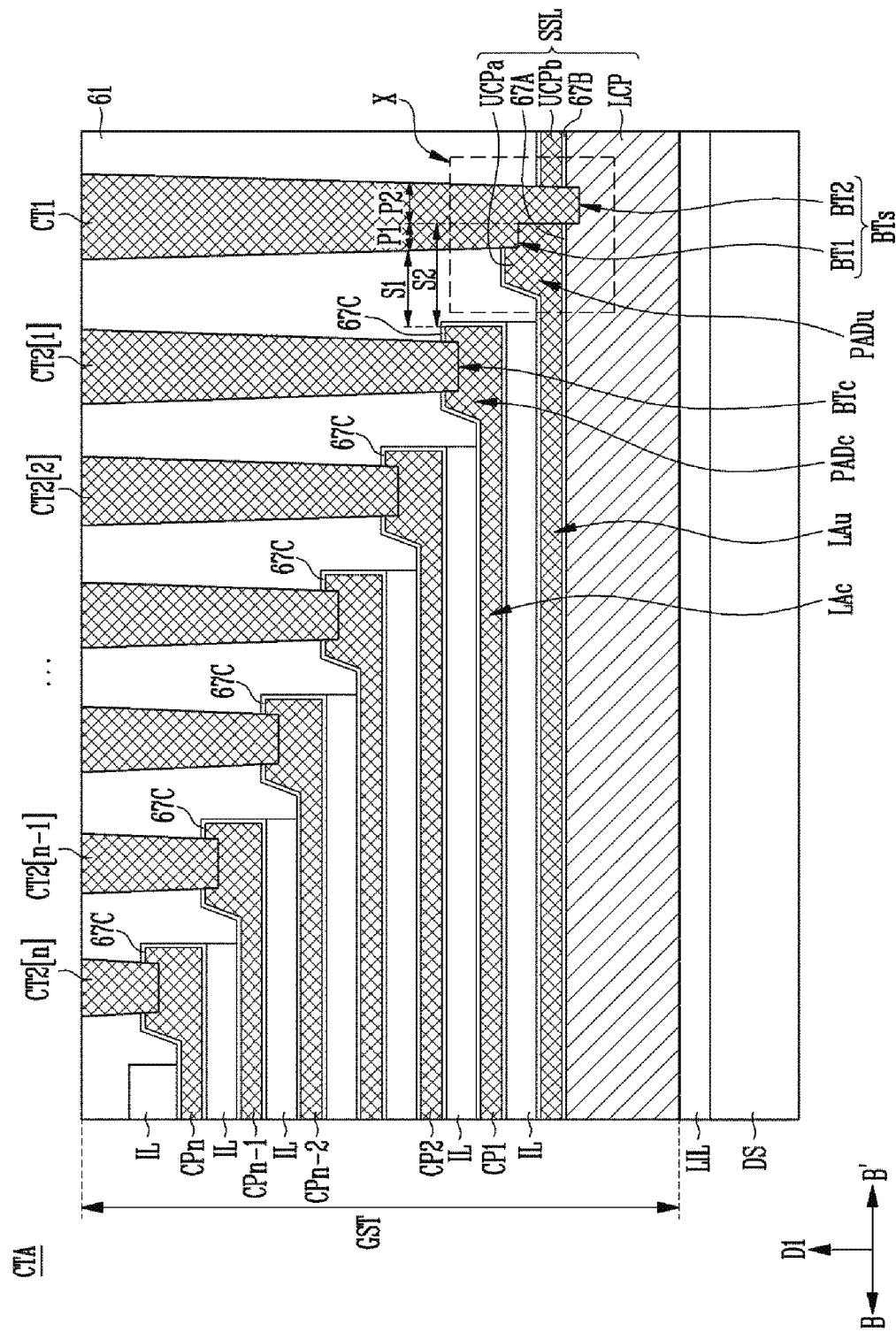
FIG. 3B is a cross-sectional view that is taken along a line B-B' shown in FIG. 2.

Each of the gate stacks GST may include a source select line SSL and conductive patterns CP1 to CPn (n is a natural number), as shown in FIGS. 3A and 3B. The source select line SSL and the conductive patterns CP1 to CPn may form a stepped structure in the contact region CTA. Contact plugs CT1 and CT2[1] to CT2[n] may contact the source select line SSL and the conductive patterns CP1 to CPn through the stepped structure.

FIG. 3A is a cross-sectional view that is taken along a line A-A' shown in FIG. 2, and FIG. 3B is a cross-sectional view that is taken along a line B-B' shown in FIG. 2.

Referring to FIGS. 3A and 3B, the gate stacks GST may overlap with a doped semiconductor film DS. The slit SI may be filled with an insulating material. Although not shown in the drawing, the insulating material, filling the slit SI, may be passed through by a vertical plug that extends from the doped semiconductor film DS in a first direction D1.

The doped semiconductor film DS may include at least one of an n-type impurity and a p-type impurity. In an embodiment, the doped semiconductor film DS may configure the common source line CSL described with reference to FIG. 1. The doped semiconductor film DS, configuring the common source line CSL, may include an n-type impurity.

Each of the gate stacks GST may overlap with a lower insulating film LIL that is formed on the doped semiconductor film DS. Each of the gate stacks GST and the lower insulating film LIL may be passed through by the channel structure CH.

The channel structure CH may be surrounded by the memory film ML. The memory film ML may include a tunnel insulating film, a data storage film that extends along an outer wall of the tunnel insulating film, and a blocking insulating film that extends along an outer wall of the data storage film. The data storage film may be formed of a material film that is capable of storing data. For example, the data storage film may be formed of a material film that is capable of storing data that is changed using Fowler-Nordheim tunneling. To this end, the data storage film may be formed of a nitride film that is capable of charge trapping. However, the present disclosure is not limited thereto. The data storage film may include silicon, a phase change material, a nano dot, or the like. The blocking insulating film may include an oxide film that is capable of blocking charge. The tunnel insulating film may be formed of a silicon oxide film that is capable of charge tunneling.

The channel structure CH may include a channel film CL, a core insulating film CO, and a capping semiconductor film CAP. The core insulating film CO and the capping semiconductor film CAP may be disposed in a center region of the channel structure CH. The capping semiconductor film CAP may be disposed on the core insulating film CO. The channel film CL may extend along a sidewall and a bottom surface of the core insulating film CO and may extend to surround the capping semiconductor film CAP. However, the present disclosure is not limited thereto. In an embodiment, the core insulating film CO may be omitted, and the center region of the channel structure CH may be filled with the channel film CL. The capping semiconductor film CAP may include doped silicon. In an embodiment, the capping semiconductor film CAP may include an n-type impurity.

The channel structure CH may have a contact surface that is in contact with the doped semiconductor film DS. In an embodiment, the channel structure CH may have a bottom surface that is in contact with the doped semiconductor film DS and may extend in the first direction D1 to pass through the memory film ML. The contact surface of the channel structure CH, which is in contact with the doped semiconductor film DS, is not limited to its portrayal in the drawing and may be varied. In an embodiment, the doped semiconductor film DS may pass through a sidewall of the memory film ML and may contact a sidewall of the channel structure CH.

Each of the gate stacks GST may include the source select line SSL, and each of the gate stacks GST may include interlayer insulating films IL and conductive patterns CP1 to CPn that are alternately stacked in the first direction D1 on the source select line SSL. The source select line SSL, the interlayer insulating films IL, and the conductive patterns CP1 to CPn may surround the channel structure CH in the cell region CA and may form a stepped structure in the contact region CTA. The stepped structure may be covered with an insulating film 61. The insulating film 61 may alleviate a step difference due to the stepped structure. The insulating film 61 may extend to cover the interlayer insulating films IL and the conductive patterns CP1 to CPn, and the insulating film 61 may surround an upper end of the channel structure CH.

The contact plugs CT1 and CT2[1] to CT2[n] may overlap with the step structure formed of the source select line SSL, the interlayer insulating films IL, and the conductive patterns CP1 to CPn. The contact plugs CT1 and CT2[1] to CT2[n] may include a first contact plug CT1, connected to the source select line SSL, and second contact plugs CT2[1] to CT2[n], respectively connected to the conductive patterns CP1 to CPn.

The source select line SSL may include a lower conductive pattern LCP, a first upper conductive pattern UCPa, a second upper conductive pattern UCPb, a first blocking insulating pattern 67A, and a second blocking insulating pattern 67B.

The lower conductive pattern LCP may surround the channel structure CH in the cell region CA. The lower conductive pattern LCP may extend to the contact region CTA. The first contact plug CT1 may overlap with the lower conductive pattern LCP of the contact region CTA. The lower conductive pattern LCP may be formed of a material that may serve as an etching stop film while forming the semiconductor memory device. The lower conductive pattern LCP may be formed to a thickness that is thicker than each of the first upper conductive pattern UCPa, the second upper conductive pattern UCPb, and the conductive patterns CP1 to CPn. In an embodiment, the lower conductive pattern LCP may include doped silicon.

During an erase operation of the semiconductor memory device, a gate induced drain leakage (GIDL) may be generated at the source select line SSL. In order to secure a GIDL current, a junction overlap region may be formed at a lower end of the channel structure CH. The junction overlap region may be defined by diffusing an impurity from the doped semiconductor film DS into the lower end of the channel structure CH, during a manufacturing process of the semiconductor memory device. The junction overlap region may be defined in various ranges according to design of the semiconductor memory device. In order to secure a stable junction overlap region, a diffusion distance of the impurity may be increased. According to an embodiment of the present disclosure, it is easy to control the junction overlap region so that the junction overlap region does not deviate from a level where an interface between the source select line SSL and the interlayer insulating film IL is disposed, through the lower conductive pattern LCP of a relatively thicker thickness. Accordingly, an off characteristic of the source select transistor that is connected to the source select line SSL may be secured, and a stable GIDL current may be secured.

The first upper conductive pattern UCPa and the second upper conductive pattern UCPb may overlap with the lower conductive pattern LCP. The first upper conductive pattern UCPa may include a line portion LAu that is disposed between the conductive patterns CP1 to CPn and the lower conductive pattern LCP, and the first upper conductive pattern UCPa may include a pad portion PADu that extends toward the first contact plug CT1 from the line portion LAu. The second upper conductive pattern UCPb may be disposed in the contact region CTA. The first contact plug CT1 may overlap with the pad portion PADu. The pad portion PADu may be formed to be thicker than the line portion LAu and the second upper conductive pattern UCPb.

The first blocking insulating pattern 67A may be disposed between the lower conductive pattern LCP and the first upper conductive pattern UCPa, and the first blocking insulating pattern 67A may extend along a surface of the first upper conductive pattern UCPa. The first upper conductive pattern UCPa may include an upper surface that faces the interlayer insulating film IL that is adjacent to the first upper conductive pattern UCPa, a sidewall that faces the channel structure CH, and a bottom surface that faces the lower conductive pattern LCP. The first blocking insulating pattern 67A may extend on each of the upper surface, the sidewall, and the bottom surface of the first upper conductive pattern UCPa.

The second blocking insulating pattern 67B may be disposed between the lower conductive pattern LCP and the second upper conductive pattern UCPb, and the second blocking insulating pattern 67B may extend along a surface of the second upper conductive pattern UCPb. The second upper conductive pattern UCPb may include a first surface that faces the lower conductive pattern LCP and a second surface that faces the insulating film 61. The second blocking insulating pattern 67B may extend on each of the first surface and the second surface of the second upper conductive pattern UCPb.

The first contact plug CT1 may pass through the first blocking insulating pattern 67A and the second blocking insulating pattern 67B, and the first contact plug CT1 may contact the lower conductive pattern LCP, the first upper conductive pattern UCPa, and the second upper conductive pattern UCPb. Accordingly, the lower conductive pattern LCP, the first upper conductive pattern UCPa, and the second upper conductive pattern UCPb may be connected to each other by the first contact plug CT1 and may receive the same signal from the first contact plug CT1.

The first contact plug CT1 may include a first portion P1 that overlaps with the first upper conductive pattern UCPa and a second portion P2 that passes through the second upper conductive pattern UCPb. The second portion P2 may extend from the first portion P1, and may be spaced apart from the conductive patterns CP1 to CPn farther than the first portion P1. For example, a distance S1 between the first portion P1 and the first conductive pattern CP1 may be shorter than a distance S2 between the first conductive pattern CP1 and the second portion P2.

The first portion P1 may overlap with the relatively thick pad portion PADu. The first portion P1 may extend into the first upper conductive pattern UCPa so that a boundary surface may be defined between the first upper conductive pattern UCPa and the first portion P1. The second portion P2 may extend into the lower conductive pattern LCP. A bottom surface BT1 of the first portion P1 may be disposed at a higher level than a bottom surface BT2 of the second portion P2. In other words, the second portion P2 may have a protruding portion extending from the boundary surface, which is defined between the first upper conductive pattern UCPa and the first portion P1, toward the lower conductive pattern LCP.

A conductive pattern of at least one layer from an uppermost layer among the conductive patterns CP1 to CPn may correspond to the drain select line. In an embodiment, the n-th conductive pattern CPn may be a first drain select line DSL1 and the (n−1)-th conductive pattern CPn−1 may be a second drain select line DSL2. The conductive patterns that are disposed between the source select line SSL and the drain select line (for example, DSL2) may be word lines. In an embodiment, the first to (n−2)-th conductive patterns CP1 to CPn−2 may be the word lines WL.

The conductive patterns CP1 to CPn may surround the channel structure CH in the cell region CA. The conductive patterns CP1 to CPn may extend to the contact region CTA toward the second contact plugs CT2[1] to CT2[n]. The second contact plugs CT2[1] to CT2[n] may respectively overlap with the conductive patterns CP1 to CPn, extending to the contact region CTA.

Each of the conductive patterns CP1 to CPn may include a line portion LAc and a pad portion PADc that extend from the line portion LAc. The line portion LAc may extend from the cell region CA to the contact region CTA and may surround the channel structure CH. The pad portion PADc may extend from the line portion LAc so as to be connected to the second contact plug that corresponds to the pad portion PADc and may be formed to be thicker than the line portion LAc. A bottom surface BTs of the first contact plug CT1 may be defined along the bottom surface BT1 of the first portion P1, a sidewall of the second portion P2 extending from the bottom surface BT1 of the first portion P1 toward the bottom surface BT2 of the second portion P2 and the bottom surface BT2 of the second portion P2. In other words, the bottom surface BTs of the first contact plug CT1 may be uneven. A bottom surface BTc of each of the second contact plugs CT2[1] to CT2[n] may be smoother than the bottom surface BTs of the first contact plug CT1 including the first portion P1 and the second portion P2.

Each of the gate stacks GST may further include third blocking insulating patterns 67C that are disposed between the interlayer insulating films IL and the conductive patterns CP1 to CPn. The third blocking insulating patterns 67C may extend along surfaces of the conductive patterns CP1 to CPn, respectively. The second contact plugs CT2[1] to CT2[n] may respectively pass through third blocking insulating patterns 67C so that the second contact plugs CT2[1] to CT2[n] may be connected to the conductive patterns CP1 to CPn, respectively.

The first upper conductive pattern UCPa and the second upper conductive pattern UCPb may be formed of the same conductive material. The conductive material, configuring the first upper conductive pattern UCPa and the second upper conductive pattern UCPb, may be different from the conductive material of the lower conductive pattern LCP that has a property restriction based on its role as the etching stop film. Each of the first upper conductive pattern UCPa and the second upper conductive pattern UCPb may be formed of a conductive material with a resistance that is lower than that of the lower conductive pattern LCP. In an embodiment, the first upper conductive pattern UCPa and the second upper conductive pattern UCPb may include metal. In an embodiment, the metal may include tungsten. RC delay of the source select line SSL may be improved by the first upper conductive pattern UCPa and the second upper conductive pattern UCPb.

Each of the conductive patterns CP1 to CPn may include the same conductive material as the conductive material configuring each of the first upper conductive pattern UCPa and the second upper conductive pattern UCPb.

Each of the first to third blocking insulating patterns 67A to 67C may include an aluminum oxide film.

The second contact plugs CT2[1] to CT2[n] may be formed of the same conductive material as the first contact plug CT1.

Figure 4:
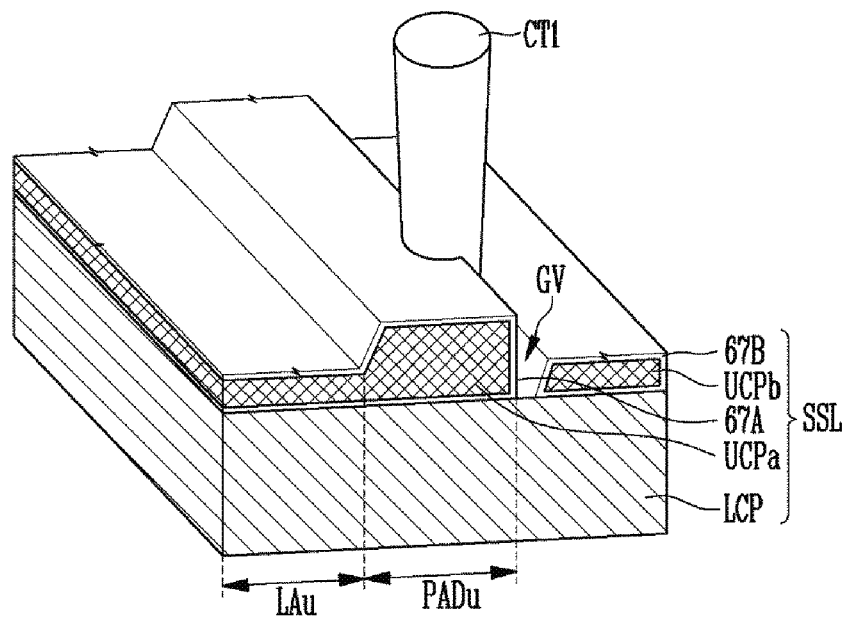
FIG. 4 is a perspective view illustrating a source select line and a first contact plug according to an embodiment of the present disclosure.

FIG. 4 is a perspective view illustrating the source select line SSL and the first contact plug CT1 according to an embodiment of the present disclosure.

Referring to FIG. 4, the source select line SSL may include a groove GV. The groove GV may be disposed between the first upper conductive pattern UCPa and the second upper conductive pattern UCPb. The second upper conductive pattern UCPb may be spaced apart from the first upper conductive pattern UCPa through the groove GV.

The pad portion PADu of the first upper conductive pattern UCPa may be disposed between the line portion LAu of the first upper conductive pattern UCPa and the second upper conductive pattern UCPb.

The first blocking insulating pattern 67A may extend on the sidewall of the first upper conductive pattern UCPa that faces the groove GV, and the second blocking insulating pattern 67B may extend on the sidewall of the second upper conductive pattern UCPb that faces the groove GV.

The first contact plug CT1 may extend into the source select line SSL through the groove GV. The first contact plug CT1 may extend into the pad portion PADu of the first upper conductive pattern UCPa that is disposed on one side of the groove GV. The first contact plug CT1 may pass through the second upper conductive pattern UCPb that is disposed on another side of the groove GV and may extend into the lower conductive pattern LCP as described with reference to FIG. 3B.

Figure 5:
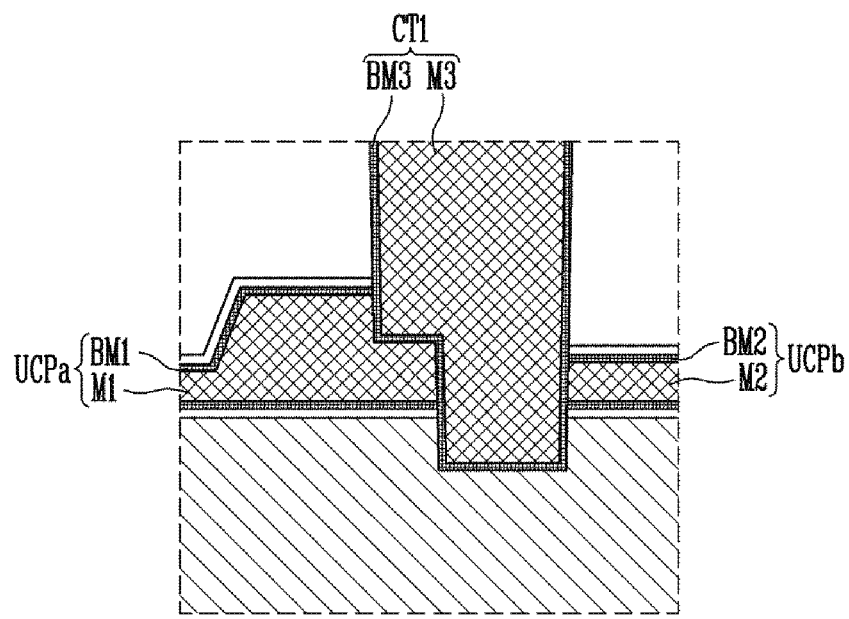
FIG. 5 is an enlarged view of a region X shown in FIG. 3B.

FIG. 5 is an enlarged view of a region X shown in FIG. 3B.

Referring to FIG. 5, the first upper conductive pattern UCPa may include a metal M1 and a barrier film BM1, the barrier film BM1 being formed on a surface of the metal M1. The second upper conductive pattern UCPb may include a metal M2 and a barrier film BM2, the barrier film BM2 being formed on a surface of the metal M2.

The metal M1 of the first upper conductive pattern UCPa and the metal M2 of the second upper conductive pattern UCPb may be the same, and the barrier film BM1 of the first upper conductive pattern UCPa and the barrier film BM2 of the second upper conductive pattern UCPb may be the same.

The first contact plug CT1 may include a metal M3 and a barrier film BM3, the barrier film BM3 being formed on a surface of the metal M3.

The above-described metals M1, M2, and M3 may be configured of various materials. In an embodiment, the metals M1, M2, and M3 may include tungsten.

The above-described barrier films BM1, BM2, and BM3 may be configured of a material that is capable of preventing diffusion of metal. In an embodiment, the barrier films BM1, BM2, and BM3 may include a titanium nitride film.

Figure 6:
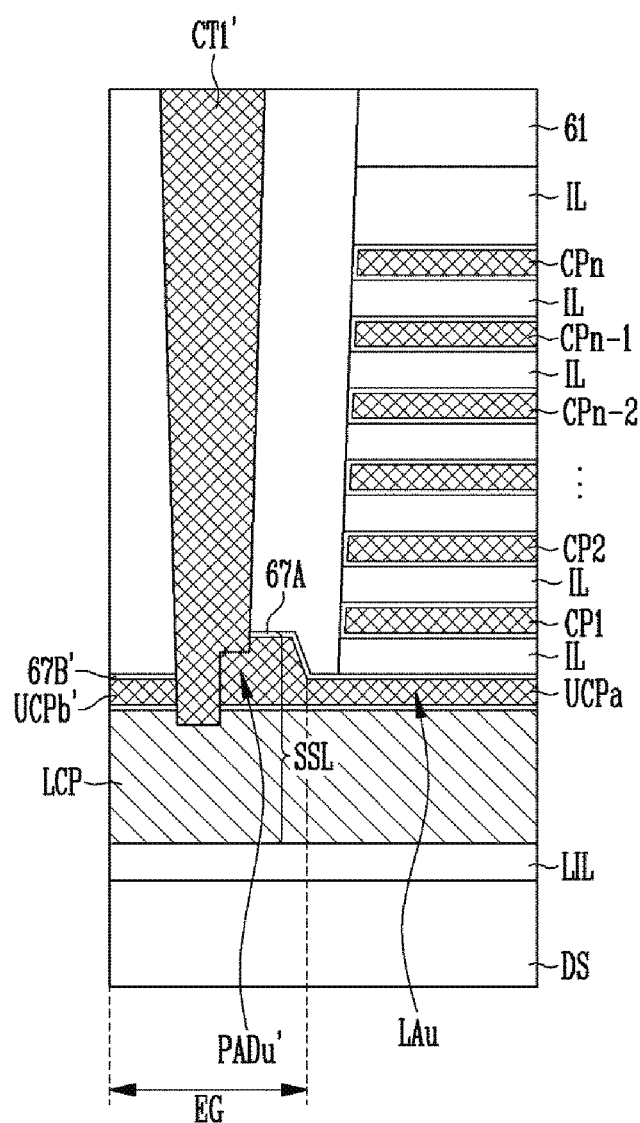
FIG. 6 is a cross-sectional view illustrating an end portion of the source select line.

FIG. 6 is a cross-sectional view illustrating an end portion EG of the source select line SSL.

Referring to FIG. 6, the end portion EG of the source select line SSL may be formed in a structure that is similar to that of the other end of the source select line SSL that is disposed in the contact region CTA described with reference to FIG. 2. The lower conductive pattern LCP, the lower insulating film LIL, and the doped semiconductor film DS may extend to overlap with the end portion EG of the source select line SSL.

The end portion EG of the source select line SSL may include an auxiliary pad portion PADu' and a third upper conductive pattern UCPb'.

The auxiliary pad portion PADu' may be a portion of the first upper conductive pattern UCPa that extends from the line portion LAu of the first upper conductive pattern UCPa. The auxiliary pad portion PADu' may be formed to be thicker than the line portion LAu and the third upper conductive pattern UCPb'. The first blocking insulating pattern 67A may extend on a surface of the auxiliary pad portion PADu' and a surface of the line portion LAu.

The third upper conductive pattern UCPb' may be spaced apart from the line portion LAu. The auxiliary pad portion PADu' may be interposed between third upper conductive pattern UCPb' and the line portion LAu. The third upper conductive pattern UCPb' may be configured of the same material as the second upper conductive pattern UCPb, described with reference to FIG. 5. A surface of the third upper conductive pattern UCPb' may be covered with a fourth blocking insulating pattern 67B'. The fourth blocking insulating pattern 67B' may be configured of the same material as the second blocking insulating pattern 67B, described with reference to FIG. 3B.

The end portion EG of the source select line SSL may be connected to the auxiliary contact plug CT1'. The auxiliary contact plug CT1' may be similar to the first contact plug CT1 described with reference to FIGS. 3B and 4. The auxiliary contact plug CT1' may include the same material as the first contact plug CT1, described with reference to FIG. 5.

The auxiliary contact plug CT1' may pass through the first blocking insulating pattern 67A and the fourth blocking insulating pattern 67B'. The auxiliary contact plug CT1' may include a portion that extends into the auxiliary pad portion PADu' and a portion that extends into the lower conductive pattern LCP. The auxiliary contact plug CT1' may be in contact with the lower conductive pattern LCP, the first upper conductive pattern UCPa, and the third upper conductive pattern UCPb'. Accordingly, the lower conductive pattern LCP, the first upper conductive pattern UCPa, and the third upper conductive pattern UCPb' may be connected to each other by the auxiliary contact plug CT1'.

End portions of the interlayer insulating films IL and the conductive patterns CP1 to CPn, adjacent to the auxiliary contact plug CT1, may overlap with the line portion LAu of the first upper conductive pattern UCPa.

FIGS. 7A to 7H are cross-sectional views illustrating a method of manufacturing the semiconductor memory device according to an embodiment of the present disclosure.

Referring to FIG. 7A, a lower insulating film 103 and a lower conductive film 105 may be formed on a doped semiconductor film 101. The doped semiconductor film 101 may include at least one of an n-type impurity and a p-type impurity. In an embodiment, the doped semiconductor film 101 may include n-type doped silicon.

The lower conductive film 105 may include a cell region CA and a contact region CTA. The lower conductive film 105 may include a conductive material that may serve as an etching stop film during an etching process for forming an upper slit 163A that is shown in FIG. 7E. In an embodiment, the lower conductive film 105 may include a doped silicon film.

Subsequently, sacrificial films 111 and interlayer insulating films 113 may be alternately stacked, one by one, on the lower conductive film 105. The sacrificial films 111 may be formed of a material that is different from that of the interlayer insulating films 113. The sacrificial films 111 may be formed of a material that is different from that of the interlayer insulating films 113 to allow selective etching. In an embodiment, the interlayer insulating films 113 may include an oxide film such as silicon oxide, and the sacrificial films 111 may include a nitride film such as silicon nitride.

Thereafter, a protective film 121 may be formed on the stack of the sacrificial films 111 and the interlayer insulating films 113. Subsequently, the protective film 121, the interlayer insulating films 113, the sacrificial films 111, and the lower conductive film 105 that overlap with the cell region CA of the lower conductive film 105 may be etched. Therefore, channel holes 131 passing through the protective film 121, the interlayer insulating films 113, the sacrificial films 111, and the lower conductive film 105 may be formed.

The channel holes 131 may pass through the lower insulating film 103 and may expose the doped semiconductor film 101.

Figure 7B:
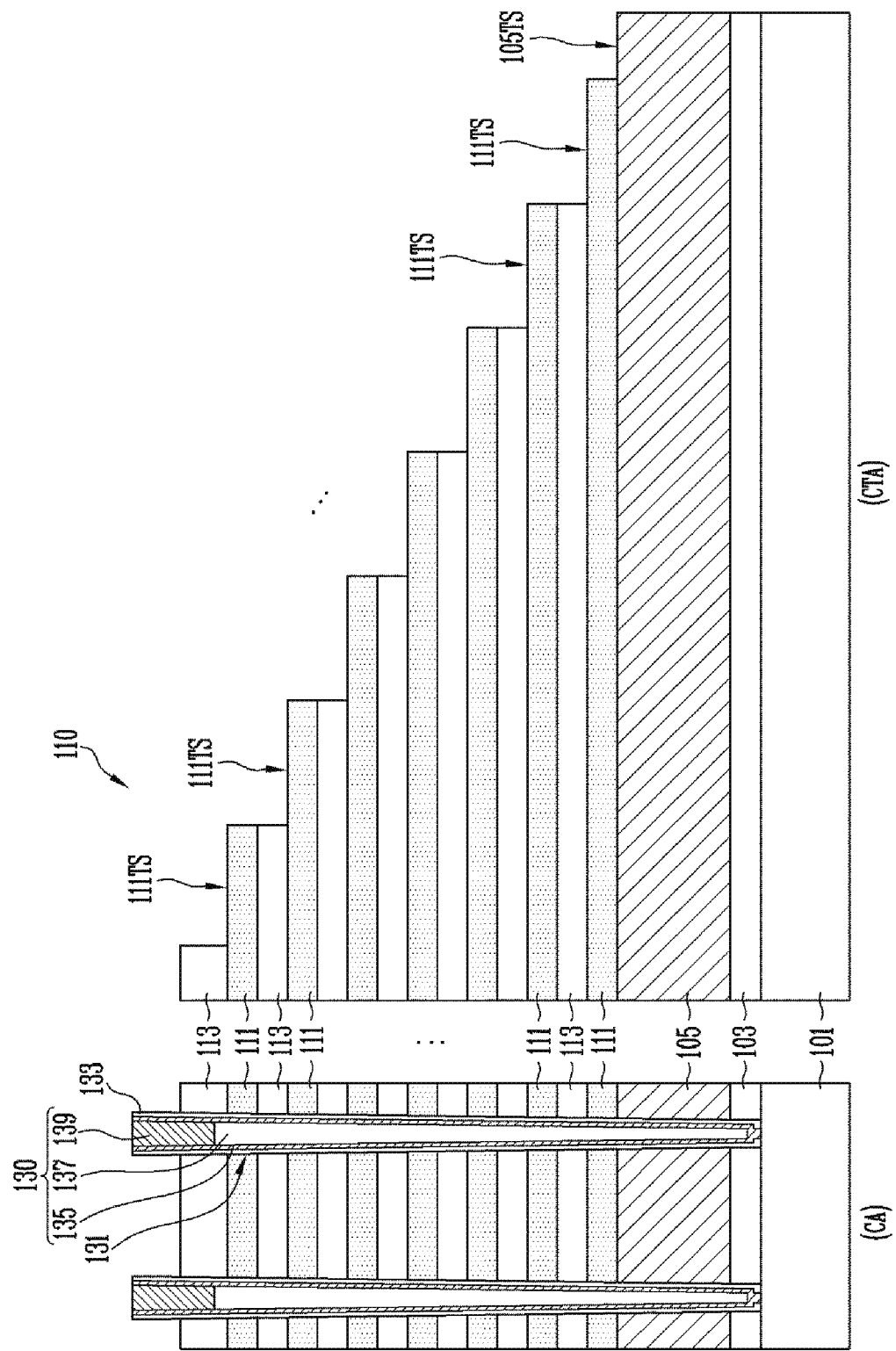
Figure 7E:
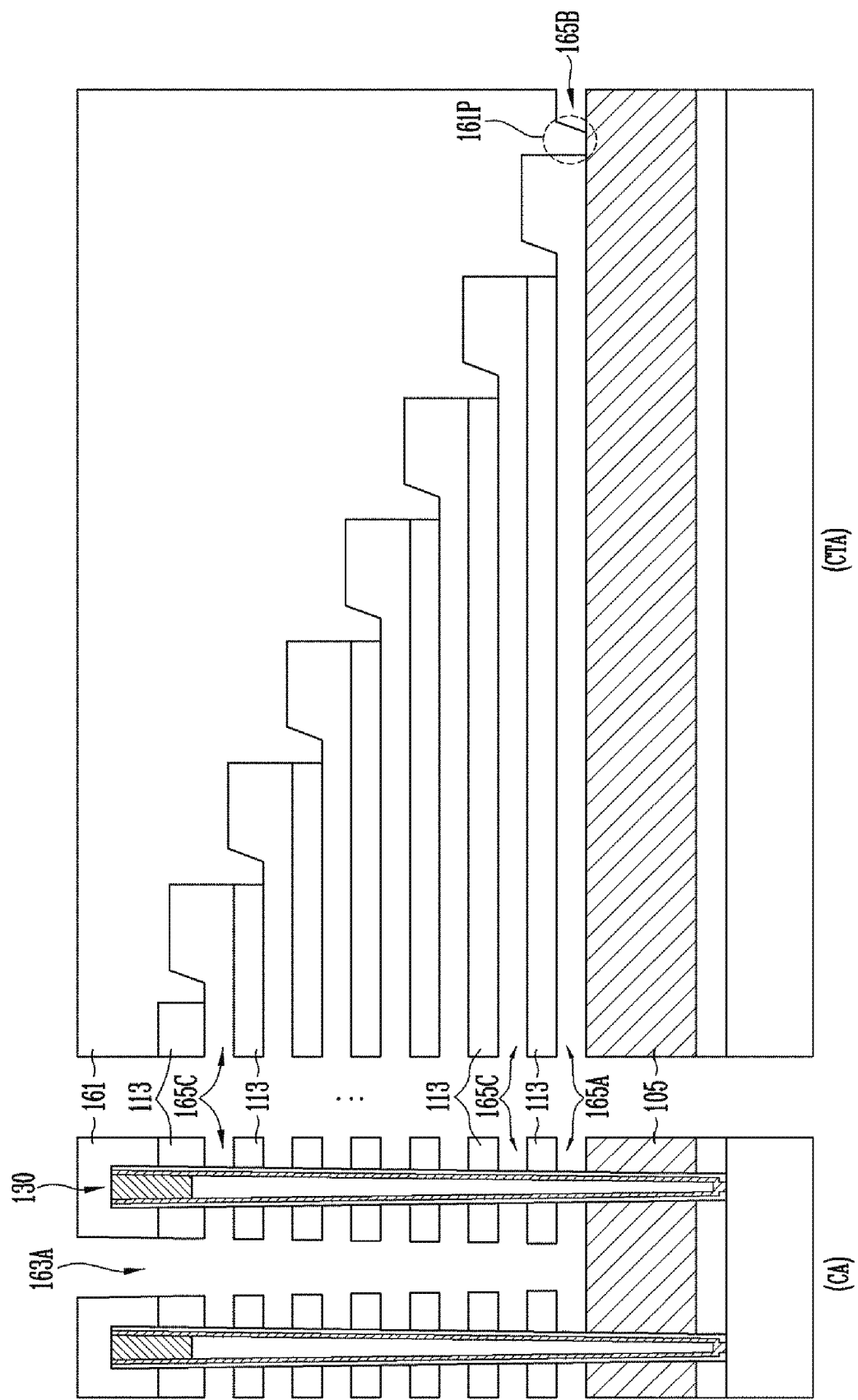

Referring to FIG. 7B, after forming a memory film 133 on a sidewall of each of the channel holes 131, a channel structure 130 may fill a channel hole 131 and may be formed on the memory film 133.

The memory film 133 may include a blocking insulating film, a data storage film, and a tunnel insulating film, each stacked on the sidewall of the channel hole 131.

The forming of the channel structure 130 may include forming a channel film 135 on the memory film 133, forming a core insulating film 137 on the channel film 135 to fill a center region of the channel hole 131, etching a portion of the core insulating film 137 to open an upper end of the channel hole 131, and filling the opened upper end of channel hole 131 with a capping semiconductor film 139. The capping semiconductor film 139 may include a doped semiconductor film. In an embodiment, the capping semiconductor film 139 may include n-type doped silicon. Forming the channel structure 130 may further include a thermal process to diffuse an impurity from the doped semiconductor film 101 into the channel film 135.

The protective film 121, shown in FIG. 7A, may be removed after the channel structure 130 is formed. The protective film 121 may prevent the loss of thickness of an uppermost interlayer insulating film 113 while forming the channel structure 130.

Subsequently, a stepped stack 110 may be formed by etching the sacrificial films 111 and the interlayer insulating films 113 that overlap with the lower conductive film 105 in the contact region CTA. An etching process for forming the stepped stack 110 may be performed to expose upper surfaces 111TS of the sacrificial films 111 and an upper surface 105TS of the lower conductive film 105.

Referring to FIG. 7C, a first pad pattern 151A and second pad patterns 151B may be formed. The first pad pattern 151A may overlap with the upper surface 105TS of the lower conductive film 105 shown in FIG. 7B and the second pad patterns 151B may respectively overlap with the upper surfaces 111TS of the sacrificial films 111 shown in FIG. 7B.

The first pad pattern 151A and the second pad patterns 151B may be formed of a material that is different from that of the interlayer insulating films 113 to allow selective etching. In an embodiment, the first pad pattern 151A and the second pad patterns 151B may include the same material as the sacrificial films 111.

The first pad pattern 151A may be adjacent to a lowermost sacrificial film 111 that is closest to the lower conductive film 105, among the sacrificial films 111. A first groove 153 may be formed between the first pad pattern 151A and the lowermost sacrificial film 111.

The second pad patterns 151B may be disposed at different levels. Second grooves 155 may be formed between the second pad patterns 151B and the interlayer insulating films 113 that face the second pad patterns 151B.

Referring to FIG. 7D, the first pad pattern 151A and the second pad patterns 151B may be covered with a first insulating film 161 that is formed on the stepped stack.

The first insulating film 161 may be formed to fill the first groove 153 and the second grooves 155 and may alleviate a step difference of the stepped stack. The first insulating film 161 may extend to cover the channel structure 130, thereby covering both the cell region CA and the contact region CTA.

Referring to FIG. 7E, an upper slit 163A that passes through the first insulating film 161, the interlayer insulating films 113, and the sacrificial films 111, shown in FIG. 7D, may be formed. The upper slit 163A may form an upper end of the slit SI, shown in FIG. 2, and may extend from the cell region CA to the contact region CTA as shown in FIG. 2.

During the etching process of the first insulating film 161, the interlayer insulating films 113, and the sacrificial films 111 to form the upper slit 163A, the lower conductive film 105 may serve as an etching stop film.

Subsequently, the sacrificial films 111, the first pad pattern 151A, and the second pad patterns 151B, shown in FIG. 7D, may be selectively removed through the upper slit 163A. Therefore, gate regions 165A, 165B, and 165C that expose the first insulating film 161 and the interlayer insulating films 113 may be defined.

The gate regions 165A, 165B, and 165C may include a first gate region 165A, a second gate region 165B, and third gate regions 165C.

The first gate region 165A may extend from a region between the lower conductive film 105 of the cell region CA and the interlayer insulating film 113 that is adjacent to the lower conductive film 105 to a region between the first insulating film 161 and the lower conductive film 105 of the contact region CTA.

The second gate region 165B may be disposed at the same level as the first gate region 165A. The first gate region 165A and the second gate region 165B may be spaced apart from each other through a protrusion portion 161P of the first insulating film 161 that filled the first groove 153 in FIG. 7D. The second gate region 165B may be defined between the lower conductive film 105 of the contact region CTA and the first insulating film 161.

The third gate regions 165C may be defined between the interlayer insulating films 113 and may extend toward the first insulating film 161.

Referring to FIG. 7F, a blocking insulating film 167 may be formed on surfaces of each of the first to third gate regions 165A to 165C of FIG. 7E. Subsequently, the first to third gate regions 165A to 165C of FIG. 7E may be filled with first to third conductive patterns 169A, 169B, and 169C, respectively.

Each of the first to third conductive patterns 169A, 169B, and 169C may be formed on the blocking insulating film. The first conductive pattern 169A and the second conductive pattern 169B may be adjacent to each other with the first groove 153 between the first conductive pattern 169A and the second conductive pattern 169B.

As described above, the first pad pattern 151A, the second pad patterns 151B, and the sacrificial films 111 of FIG. 7D may be replaced with a conductive material, configuring the first to third conductive patterns 169A to 169C of FIG. 7F, through the upper slit 163A. The conductive material may include the metal and the barrier film, described with reference to FIG. 5.

After forming the first to third conductive patterns 169A to 169C, a lower slit 163B, connected to the upper slit 163A and passing through the lower conductive film 105, may be formed. The lower slit 163B may pass through the lower insulating film 103 and may expose the doped semiconductor film 101. The lower slit 163B may configure a lower end of the slit SI, shown in FIG. 2, and may extend from the cell region CA to the contact region CTA, as shown in FIG. 2.

Referring to FIG. 7G, a second insulating film 171 that fills the upper slit 163A and the lower slit 163B, shown in FIG. 7F, may be formed. The second insulating film 171 may extend to overlap with the first insulating film 161.

Subsequently, contact holes 173A and 173B, passing through the second insulating film 171, the first insulating film 161, and the blocking insulating film 167, and exposing end portions of the first to third conductive patterns 169A to 169C, may be formed. The contact holes 173A and 173B may include a first contact hole 173A and second contact holes 173B.

The first contact hole 173A may extend into the lower conductive film 105 through the first groove 153, shown in FIG. 7F. The first contact hole 173A may include a first portion HP1 and a second portion HP2 that are formed to be deeper than the first portion HP1. The first portion HP1 may extend into an end portion of the first conductive pattern 169A, overlapping with the contact region CTA of the lower conductive film 105. The second portion HP2 may pass through an end portion of the second conductive pattern 169B and may extend into the lower conductive film 105.

The second contact holes 173B may extend into each of the end portions of the third conductive patterns 169C that overlap with the contact region CTA of the lower conductive film 105.

Figure 7H:
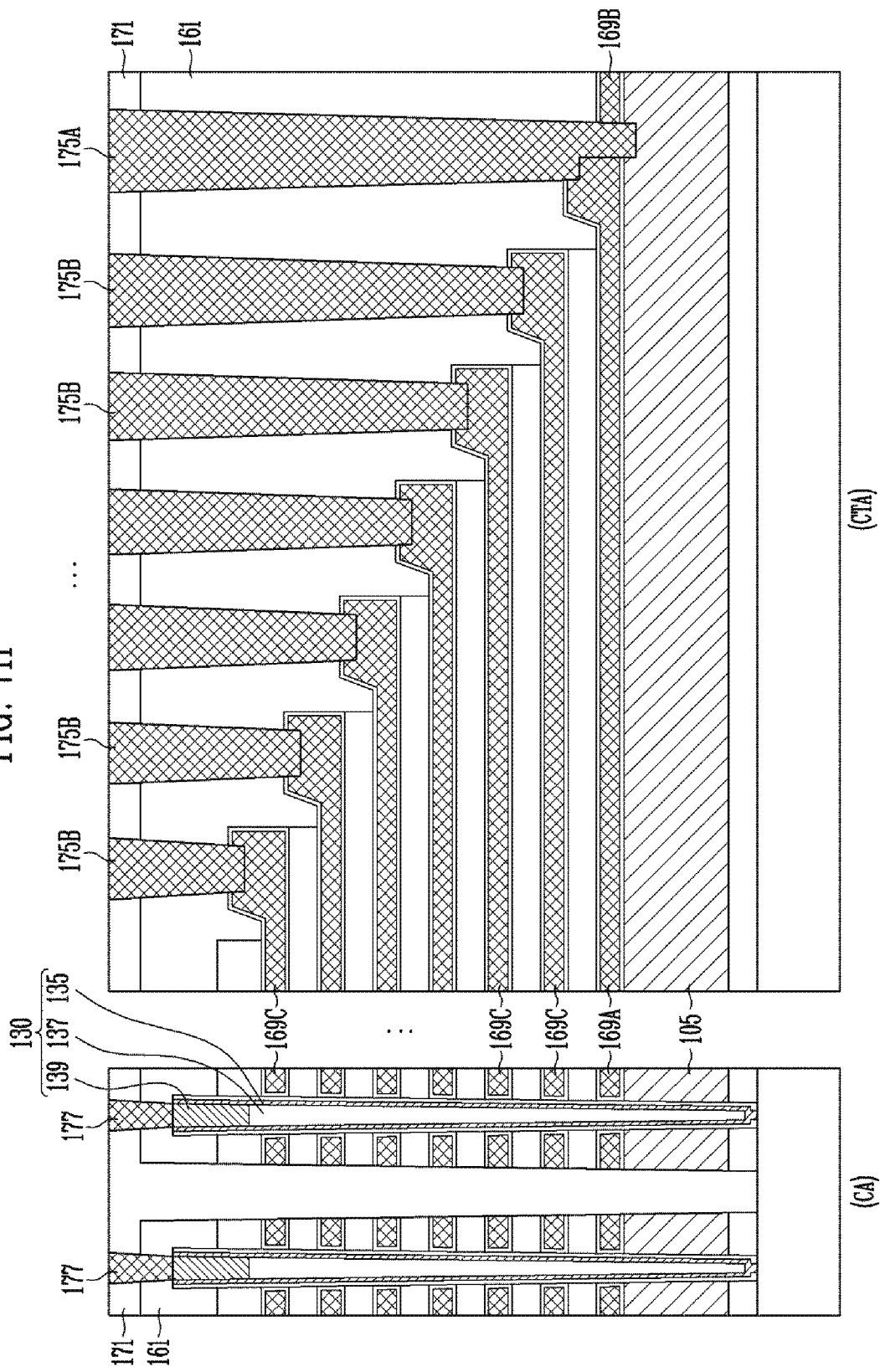

Referring to FIG. 7H, a first contact plug 175A that fills the first contact hole 173A of FIG. 7G and second contact plugs 175B that respectively fill the second contact holes 173B of FIG. 7G may be formed.

The first contact plug 175A may include a first portion that extends into the first conductive pattern 169A and a second portion that extends into the lower conductive film 105. The first conductive pattern 169A, the lower conductive film 105, and the second conductive pattern 169B may be connected to each other by the first contact plug 175A.

The second contact plugs 175B may be connected to the third conductive patterns 169C, respectively.

Subsequently, a bit line contact plug 177 that passes through the second insulating film 171 and the first insulating film 161 may be formed to be in contact with the channel structure 130. Thereafter, a subsequent process of forming a bit line (not shown) that is connected to the bit line contact plug 177 may be performed.

According to the present disclosure, the first groove 153 may overlap with the lower conductive film 105 as described with reference to FIG. 7C, and the first contact hole 173A may overlap with the first groove 153 as described with reference to FIG. 7G. Therefore, the lower conductive film 105, the first conductive pattern 169A, and the second conductive pattern 169B may be exposed through the first contact hole 173A, and the lower conductive film 105, the first conductive pattern 169A, and the second conductive pattern 169B may be connected to each other through the first contact plug 175A that fills the first contact hole 173A.

FIGS. 8A to 8C are cross-sectional views illustrating an embodiment of forming the pad patterns 151A and 151B shown in FIG. 7C.

Referring to FIG. 8A, a pad film 151 may be formed on a surface of the stepped stack 110 that is shown in FIG. 7B. Subsequently, an etching barrier film 152 may be formed on the pad film 151.

The etching barrier film 152 may include an oxide film. The etching barrier film 152 may be deposited relatively thicker on an upper surface of the pad film 151 than on a sidewall of the pad film 151. To this end, the etching barrier film 152 may be deposited through a high density plasma chemical vapor deposition (HDP CVD) method.

Referring to FIG. 8B, etching barrier patterns 152P may be formed by etching the etching barrier film 152 of FIG. 8A, thereby exposing portions of the pad film 151.

Although a portion of the etching barrier film 152 that is formed on the sidewall of the pad film 151 is removed, another portion of the etching barrier film 152 that is formed relatively thick on the upper surface of the pad film 151 may remain as the etching barrier pattern 152P. The etching barrier film 152, including an oxide film, may be etched by hydrofluoric acid (HF).

Referring to FIG. 8C, some regions of the pad film 151 that are exposed between the etching barrier patterns 152P of FIG. 8B may be removed by an etching process. Therefore, the pad film 151 may be separated into pad patterns 151A, 151B, and 151C. Thereafter, the etching barrier patterns 152P may be removed.

The pad film 151 that is formed of a nitride film may be etched through an isotropic etching process by using phosphoric acid.

Other regions of the pad film 151 that are protected by the etching barrier patterns 152P while etching the pad film 151 may remain as the pad patterns 151A, 151B, and 151C. The pad patterns 151A, 151B, and 151C may include a first pad pattern 151A, second pad patterns 151B, and a third pad pattern 151C.

The third pad pattern 151C may be disposed on the uppermost interlayer insulating film 113. The third pad pattern 151C may be removed in a subsequent process. Therefore, as shown in FIG. 7C, the first pad pattern 151A and the second pad patterns 151B may remain on the stepped stack.

Figure 9:
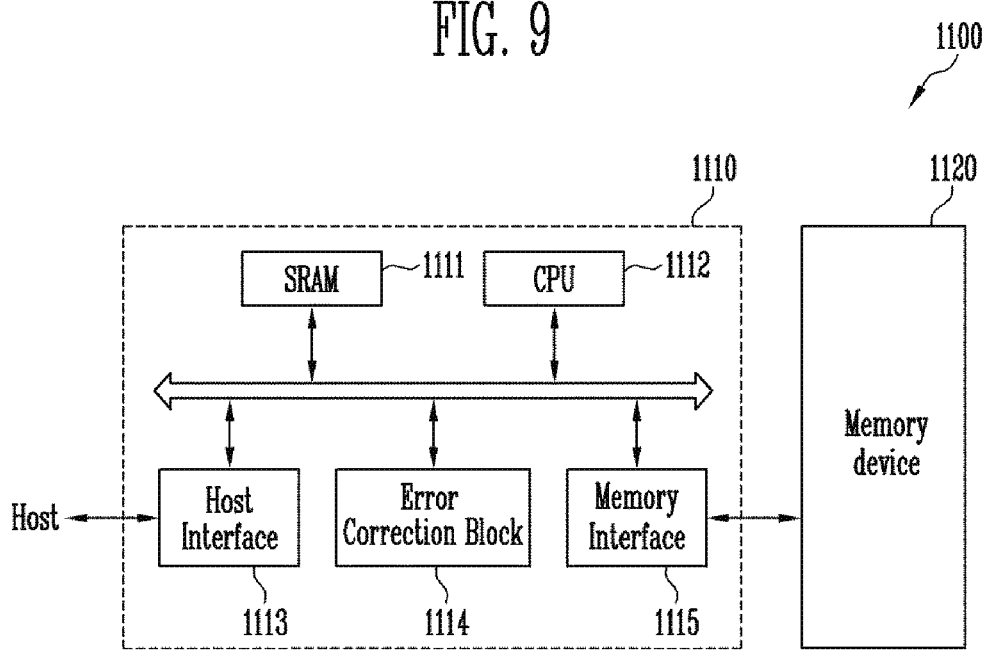
FIG. 9 is a block diagram illustrating a configuration of a memory system according to an embodiment of the present disclosure.

FIG. 9 is a block diagram illustrating a configuration of a memory system 1100 according to an embodiment of the present disclosure.

Referring to FIG. 9, the memory system 1100 includes a memory device 1120 and a memory controller 1110.

The memory device 1120 may include the structure, described with reference to FIGS. 2, 3A, 3B, 4, 5, and 6. In an embodiment, the memory device 1120 may include the source select line having the groove and the contact plug extending into the source select line through the groove. The memory device 1120 may be a multi-chip package configured of a plurality of flash memory chips.

The memory controller 1110 may be configured to control the memory device 1120 and may include a static random access memory (SRAM) 1111, a central processing unit (CPU) 1112, a host interface 1113, and an error correction block 1114, and a memory interface 1115. The SRAM 1111 may be used as an operation memory of the CPU 1112, the CPU 1112 performs various control operations for exchanging data of the memory controller 1110, and the host interface 1113 includes a data exchange protocol of a host that is connected to the memory system 1100. In addition, the error correction block 1114 may detect and correct an error that is included in data read from the memory device 1120, and the memory interface 1115 may perform an interfacing with the memory device 1120. In addition, the memory controller 1110 may further include a read only memory (ROM) or the like for storing code data for interfacing with the host.

The memory system 1100, described above, may be a memory card or a solid state drive (SSD) in which the memory device 1120 and the memory controller 1110 are combined to each other. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 10:
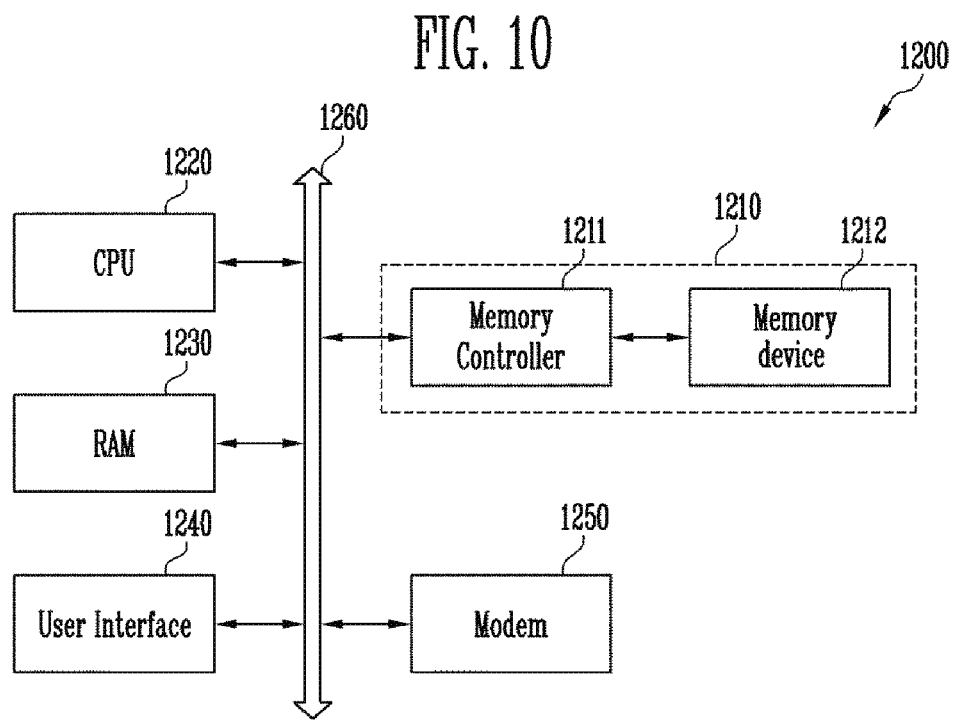
FIG. 10 is a block diagram illustrating a configuration of a computing system according to an embodiment of the present disclosure.

FIG. 10 is a block diagram illustrating a configuration of a computing system 1200 according to an embodiment of the present disclosure.

Referring to FIG. 10, the computing system 1200 may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, an image processor, a mobile DRAM, and the like may be further included.

The memory system 1210 may be configured of a memory device 1212 and a memory controller 1211, as described with reference to FIG. 9.

Embodiments of the present disclosure may stably connect a contact plug to a source select line through a groove formed in the source select line.

What is claimed is:

1. A semiconductor memory device comprising:
    a channel structure extending in a first direction;
    a source select line surrounding the channel structure and including a groove;
    interlayer insulating films and word lines surrounding the channel structure, wherein the interlayer insulating films and the word lines are alternately stacked on the source select line in the first direction; and
    a first contact plug extending into the source select line through the groove.

2. The semiconductor memory device of claim 1, wherein the source select line comprises:
    a lower conductive pattern extending through a cell region and a contact region, wherein the lower conductive pattern surrounds the channel structure in the cell region and overlaps with the groove and the first contact plug in the contact region;
    a first upper conductive pattern overlapping with the lower conductive pattern;
    a second upper conductive pattern, spaced apart from the first upper conductive pattern, with the groove interposed between the first upper conductive pattern and the second upper conductive pattern, in the contact region;
    a first blocking insulating pattern disposed between the first upper conductive pattern and the lower conductive pattern and extending along a surface of the first upper conductive pattern; and
    a second blocking insulating pattern disposed between the second upper conductive pattern and the lower conductive pattern and extending along a surface of the second upper conductive pattern.

3. The semiconductor memory device of claim 2, wherein the first contact plug passes through the first blocking insulating pattern and the second blocking insulating pattern, and contacts the lower conductive pattern, the first upper conductive pattern, and the second upper conductive pattern.

4. The semiconductor memory device of claim 2, wherein the first contact plug comprises:
    a first portion overlapping with the first upper conductive pattern; and
    a second portion passing through the second upper conductive pattern and extending into the lower conductive pattern.

5. The semiconductor memory device of claim 4, wherein a bottom surface of the first portion is disposed at a higher level than a bottom surface of the second portion.

6. The semiconductor memory device of claim 4, wherein the first portion extends into the first upper conductive pattern,
wherein a boundary surface is defined between the first upper conductive pattern and the first portion, and
wherein the second portion has a protruding portion extending from the boundary surface toward the lower conductive pattern.

7. The semiconductor memory device of claim 2, wherein the lower conductive pattern includes doped silicon, and
the first upper conductive pattern and the second upper conductive pattern include a metal.

8. The semiconductor memory device of claim 2, wherein the first upper conductive pattern comprises:
a line portion between the word lines and the lower conductive pattern; and
a pad portion extending from the line portion toward the first contact plug,
wherein the pad portion is formed to be thicker than each of the line portion and the second upper conductive pattern.

9. The semiconductor memory device of claim 2, wherein the lower conductive pattern is formed to be thicker than each of the first upper conductive pattern and the word lines.

10. The semiconductor memory device of claim 1, wherein a bottom surface of the first contact plug is uneven.

11. The semiconductor memory device of claim 1, wherein the first contact plug comprises:
a first portion adjacent to the word lines; and
a second portion formed to be farther apart from the word lines than the first portion.

12. The semiconductor memory device of claim 11, wherein the second portion extends farther toward the source select line than the first portion.

13. The semiconductor memory device of claim 1, further comprising:
second contact plugs extending from the word lines in the first direction,
wherein a bottom surface of each of the second contact plugs is smoother than a bottom surface of the first contact plug.

14. The semiconductor memory device of claim 13, wherein each of the word lines comprises:
a line portion surrounding the channel structure; and
a pad portion extending from the line portion to be connected to one of the second contact plugs,
wherein the pad portion is formed to be thicker than the line portion.

15. The semiconductor memory device of claim 14, further comprising:
a third blocking insulating pattern disposed between each of the interlayer insulating films and each of the word lines and extending along a surface of each of the word lines,
wherein each of the second contact plugs passes through the third blocking insulating pattern.

16. A method of manufacturing a semiconductor memory device, the method comprising:
forming a lower conductive film;
forming a stepped stack including alternately stacked sacrificial films and interlayer insulating films on the lower conductive film, such that upper surfaces of the sacrificial films are exposed;
forming a first pad pattern overlapping with the lower conductive film, wherein the first pad pattern is adjacent to a lowermost sacrificial film among the sacrificial films, and wherein a groove is interposed between the first pad pattern and the lowermost sacrificial film;
forming second pad patterns respectively overlapping with the upper surfaces of the sacrificial films;
forming an insulating film covering the first and second pad patterns and the stepped stack;
replacing the sacrificial films, the first pad pattern, and the second pad patterns with a conductive material; and
forming a first contact plug passing through a portion of the insulating film that overlaps with the groove, and extending into the lower conductive film.

17. The method of claim 16, wherein replacing the sacrificial films, the first pad pattern, and the second pad patterns with the conductive material comprises:
forming gate regions by removing the sacrificial films, the first pad pattern, and the second pad patterns to expose the insulating film and the interlayer insulating films;
forming a blocking insulating film on a surface of each of the gate regions; and
forming conductive patterns filling each of the gate regions, on the blocking insulating film.

18. The method of claim 17, wherein the first contact plug passes through the blocking insulating film.

19. The method of claim 17, wherein the conductive patterns include a first conductive pattern and a second conductive pattern that are adjacent to each other with the groove interposed between the first conductive pattern and the second conductive pattern,
wherein the first contact plug includes a first portion extending into the first conductive pattern and a second portion extending farther than the first portion, and
wherein the second portion extends into the lower conductive film by passing through the second conductive pattern.

20. The method of claim 16, wherein forming the first pad pattern and forming the second pad patterns comprises:
forming a pad film extending along a surface of the stepped stack;
forming etching barrier patterns on the pad film; and
removing partial regions of the pad film exposed between the etching barrier patterns.

* * * * *